United States Patent [19]
Schuler et al.

[11] Patent Number: 5,527,586
[45] Date of Patent: Jun. 18, 1996

[54] APPARATUS AND METHOD FOR DEPOSITING METAL PARTICLES ON A DIELECTRIC SUBSTRATE

[75] Inventors: Eleanor Schuler, Rio Rancho; Burt DeVolk; Kim Krubsack, both of Albuquerque, all of N.M.

[73] Assignee: Printron, Inc., Albuquerque, N.M.

[21] Appl. No.: 358,669

[22] Filed: Dec. 19, 1994

Related U.S. Application Data

[63] Continuation of Ser. No. 853,552, Mar. 18, 1992, abandoned.

[51] Int. Cl.$^6$ ........................................... B32B 9/00
[52] U.S. Cl. ...................... 428/164; 427/282; 427/272; 427/133; 428/209; 428/901; 264/67
[58] Field of Search ........................ 428/209, 210, 428/688, 689, 701, 698, 901, 131, 134, 137, 161, 164; 427/282, 272, 133, 559; 156/664; 83/30, 23, 33, 34, 35; 264/67; 29/843, 846; 434/87; 420/469; 205/75; 101/123

[56] References Cited

U.S. PATENT DOCUMENTS

| | | | |
|---|---|---|---|
| 3,013,913 | 12/1961 | Croop | 428/209 |
| 4,237,209 | 12/1980 | Oliver | 427/272 |
| 4,242,802 | 1/1981 | Jenner | 434/87 |
| 4,803,110 | 2/1989 | Ahn et al. | 428/698 |
| 4,868,093 | 9/1989 | Levy | 428/698 |
| 4,905,592 | 5/1990 | Sorel | 101/123 |
| 5,014,420 | 5/1991 | Howard | 29/846 |
| 5,155,905 | 10/1992 | Miller | 29/843 |
| 5,236,572 | 8/1993 | Lam | 205/75 |
| 5,389,408 | 2/1995 | DeVolk | 427/559 |
| 5,403,376 | 4/1995 | DeVolk | 420/469 |

FOREIGN PATENT DOCUMENTS

| 94711 | 11/1983 | European Pat. Off. | 427/282 |
|---|---|---|---|

OTHER PUBLICATIONS

Rikoski, "Hybrid Microelectronic Circuits The Thick Film", (1973) pp. 158–169.
Topfer, "Thick Film Microelectronics," Van Nostrand Reinhold, Co., 1971, pp. 60–69.

*Primary Examiner*—Patrick J. Ryan
*Assistant Examiner*—Patrick R. Jewik
*Attorney, Agent, or Firm*—Lowe, Price, LeBlanc & Becker

[57] ABSTRACT

A method and apparatus for making a template used in manufacturing printed circuit boards is disclosed. The template is made from boron nitride, silicon nitride or similar material which has a melting temperature higher than the melting temperature of the metal forming the conductors in the printed circuit board, is readily machinable or moldable with the desired circuit pattern, and does not adhere to the metal conductors after the metal particles have been melted onto the substrate.

18 Claims, 5 Drawing Sheets

APPARATUS AND METHOD FOR DEPOSITING METAL PARTICLES ON A DIELECTRIC SUBSTRATE

This application is a continuation of application Ser. No. 07/853,552 filed Mar. 18, 1992, now abandoned.

TECHNICAL FIELD

This invention relates generally to an apparatus and method for depositing metal particles on a dielectric substrate and, more particularly, to a method and apparatus for depositing metal particles in a predetermined pattern on a dielectric substrate for use in making printed circuit boards.

BACKGROUND ART

A number of attempts have been made to manufacture printed circuit boards using powdered metal. An example is found in U.S. Pat. No. 4,614,837, which discloses a three-step process. First, metal particles of less than 75 microns in size are applied over the surface of a substrate made of a dielectric material which softens on application of heat, hardens on removal of heat and is not materially affected by the softening and hardening process. Second, a die formed into the desired circuit pattern is heated and pressed against the powdered surface of the substrate at high pressure (20,000–50,000 psi) and room temperature to compact the powder underneath the die head into the desired circuit pattern on the substrate. Third, the die is heated to 200° C. and applied at lower pressure (10,000 psi) to the substrate for 20–60 minutes, thereby embedding the compacted powder into the surface of the substrate to a depth of approximately 75 microns.

Another process for making printing circuit boards from metal powders is disclosed in U.S. Pat. No. 4,698,907. The first step in this process is to form a master pattern of the desired circuit. Next, conductive metal particles having a thin, non-conductive coating are applied to the master pattern by electrostatic forces. A non-conductive substrate is then placed close to the master pattern and electrostatic forces transfer the conductive powder from the master pattern onto the substrate in the desired pattern. While this patent discloses the need to fuse the particles in order to complete manufacture of a low resistance electrically conductive path, it does not provide any details as to how this can be accomplished. One method for doing so, however, is shown in U.S. Pat. No. 5,014,420, which discloses a method of fusing the positive particles using an intense, highly-concentrated high-frequency electromagnetic field.

A number of additive processes for making printed circuit boards require that the metal particles be mixed with a viscous carrier to ensure that the particles remain in the desired pattern on the substrate during the curing process. For example, U.S. Pat. No. 2,993,815 discloses application of a paste containing copper particles in glass frit to a refractory substrate in the desired pattern. The substrate is then heated in an oven to sinter the metal, causing it to bond to the substrate. In U.S. Pat. No. 4,278,702, a silk screen is used to apply a paste comprising powdered metal particles and binder to the substrate in the desired circuit pattern and a high frequency magnetic field is then used to sinter the particles at a sufficiently low temperature that the substrate is not warped or melted.

Each of the foregoing prior art processes suffers from a number of disadvantages. For example, in those in which the metal particles are suspended in a viscous carrier, the carrier must be driven off during the curing process in order to obtain a satisfactory conductive trace. This complicates the manufacturing process because the metal particles must first be mixed into a suitable carrier and the carriers must then be driven off prior to curing the metal particles, the latter of which takes substantial time relative to the time needed for curing. These processes also require the use of screen printers, which substantially increase the cost of equipment needed to manufacture printed circuit boards.

The prior art processes for making printed circuit boards directly from metal particles also suffer from a number of disadvantages. First, these processes require the use of expensive machinery for applying the metal particles in the desired circuit pattern on the substrate, e.g., an electrostatic printer or a die capable of exerting high pressures on the substrate. Second, these processes are only suitable for sintering the metal particles or require that the metal particles first be coated with a non-conducting material before being cured.

Accordingly, one object of the present invention is to provide a method and apparatus for depositing metal particles on a dielectric substrate in a predetermined circuit pattern without need of wetting agents or binders.

Another object of the present invention is to provide an apparatus and method for depositing metal particles on a dielectric substrate in a desired circuit pattern without a screen printer, electrostatic printer or other similar printing apparatus.

Yet another object of the present invention is to provide a method and apparatus for depositing metallic particles on a dielectric substrate in a desired circuit pattern so that they may thereafter be melted into continuous conductors in the desired pattern without having to first drive off any carriers or wetting agents.

A further object of the instant invention is to provide a method and apparatus for depositing metal particles on a dielectric substrate quickly and inexpensively.

Still another object of the instant invention is to provide a method and apparatus for depositing metal particles on a dielectric substrate so that such particles can be rapidly cured.

Additional objects, advantages and novel features of the invention will be set forth in part in the description which follows, and in part will become apparent to those skilled in the art upon examination of the following or may be learned by practice of the invention. The objects and advantages of the invention may be realized and obtained by means of the instrumentalities and combinations particularly pointed out in the appended claims.

DISCLOSURE OF THE INVENTION

In accordance with these and other objects, the subject invention comprises a template for use in making printed circuit boards in which metal conductors are applied in a predetermined pattern to a dielectric substrate. The template comprises a sheet of material which has a melting temperature higher than the melting temperature of the metal particles used to form the conductors and openings therethrough in the desired pattern. This material does not adhere to the conductors after the melting step has been performed and is readily moldable or machinable. Suitable materials for the template include boron nitride and silicon nitride.

In accordance with another aspect of the invention the template is formed by making a mold in the desired circuit pattern, pouring a slurry of the template material into the mold and then heating this material under pressure. Alternatively, the template is formed by milling the desired circuit pattern in a solid sheet of the template material.

BRIEF DESCRIPTION OF THE DRAWINGS

Further objects and advantages of the present invention will become apparent from the following detailed description when taken in conjunction with the drawings in which.

DESCRIPTION OF THE PREFERRED EMBODIMENTS

Figure 1:
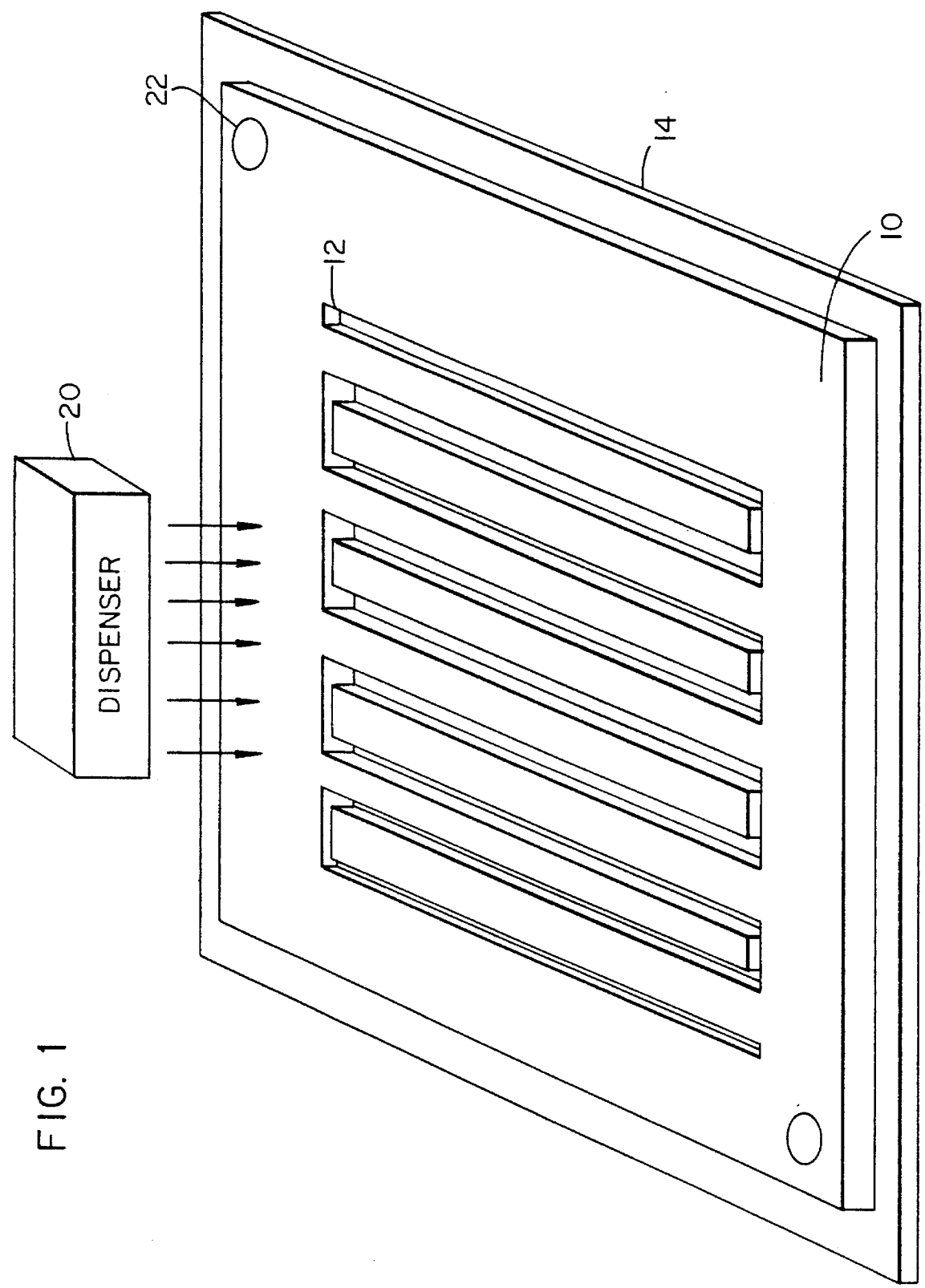
FIG. 1 is a perspective view of the template of the present invention clamped to a dielectric substrate on which a printed circuit board is to be formed.

Referring to FIG. 1, a template 10 in accordance with the subject invention is shown with a continuous opening 12 formed therethrough in the shape of a test pattern of a circuit to be formed on a dielectric substrate 14. It should be understood that the test pattern represented by opening 12 in FIG. 1 is only for illustrative purposes and that the openings in template 10 may be formed in any desired circuit pattern, in the manner described hereinafter.

In the preferred embodiment template 10 is made of a refractory material such as boron nitride. This material is used because it is easily moldable and machinable, has a melting temperature substantially higher than the melting temperature of copper, silver and other metals which may be used to form conductors on substrate 14, and does not adhere to the conductors after they have been cured. Another suitable material for template 10 having these characteristics is silicon nitride. It also should be understood that other refractory materials may be used which have these desirable characteristics.

In the preferred embodiment substrate 14 may be made of a ceramic, such as mullite or alumina, or any other material suitable for withstanding temperatures at the melting point of the metallic particles deposited thereon for the period of time required for curing.

Figure 2:
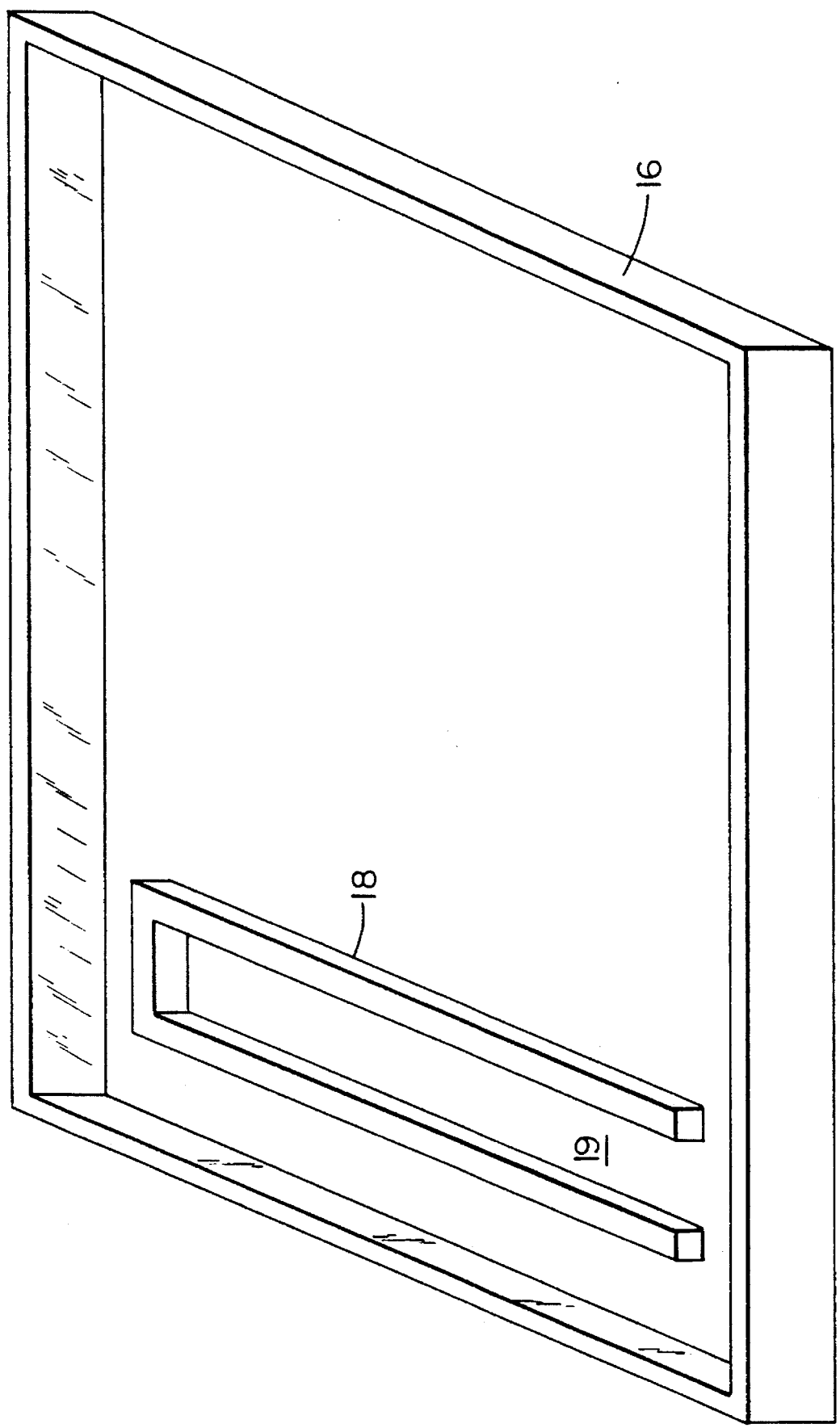
FIG. 2 is a perspective view of a mold used to make the template of FIG. 1.

FIG. 2 illustrates a mold 16 used to produce template 10. Mold 16 is made of cast iron or other suitable material. It has a series of upstanding ridges 18 in the same pattern as openings 12, i.e., the same pattern as the conductive traces to be deposited on substrate 14. Mold 16 may be made in any conventional manner, such as by milling the desired pattern therein using computer numerical control ("CNC") milling equipment, or by conventional chemical milling or etching techniques.

Template 10 may be molded in conventional manner. For example, after mold 16 has been made, a slurry of boron nitride is poured into it. The mold is then heated with or without pressure applied to the boron nitride so that the resulting template is of the same thickness as the desired circuit board traces. If, for example, the desired trace thickness is 10 mils, template 10 will be 10 mils thick. After cooling, template 10 is removed from mold 16.

In an alternative embodiment, template 10 is made by first preparing a solid sheet of boron nitride in conventional manner to the same thickness as the thickness of the desired circuit traces. The trace pattern is then milled into this sheet in the desired circuit pattern using a conventional CNC milling machine.

Referring again to FIG. 1, the first step in preparing the traces for curing is to place template 10 on substrate 14. In this figure both template 10 and substrate 14 are shown as being rectangular, with template 10 being slightly shorter in width and depth. It should be understood, however, that the surface of both the substrate and template may be of any desired two-dimensional shape and that the only limitation on the relative size of the substrate and template is that the trace pattern fit onto the substrate.

Template 10 is secured to substrate 14 prior to dispensing metallic powder. In the preferred embodiment template 10 and substrate 14 have a plurality of locator holes 22 around the periphery thereof. As shown in FIG. 1, only two such holes are needed to prevent lateral movement of template 10 relative to substrate 14, although additional holes may be used if desired. Locator holes 22 are located so as not to interfere with openings 12 in template 10 and each is aligned with a corresponding hole in substrate 14. Template 10 is secured to substrate 14 by inserting conventional clamping screws, not shown, into locator holes 22. Such screws are made of nonconducting material so as to avoid heating during the curing process.

Metallic particles are dispensed from a dispenser 20, shown schematically in FIG. 1, onto the top of template 10. Suitable particles include, for example, particles of copper, copper/silver alloy or tin/copper alloy. The size distribution of these particles must be such that there is minimal shrinkage in the deposited pattern after the particles have melted. A suitable distribution is disclosed in U.S. Pat. No. 5,403,376, entitled "Particle Size Distribution for Controlling Flow of Metal Powders to Form Electrical Conductors" and assigned to PrinTron, Inc., which application is incorporated by reference herein.

Any suitable technique may be used for applying the metal particles to the surface of template 10. Such techniques include screening, spreading the particles with a squeegee, spraying or depositing by electrostatic deposition. Since these techniques are well known in the art, they are not further described herein. After the particles have been applied, any excess particles lying on the upper surface of template 10 are removed so that the only particles remaining are those in openings 12. Such removal can be accomplished in any conventional manner, such as by a doctor blade, brush or air knife.

Figure 3:
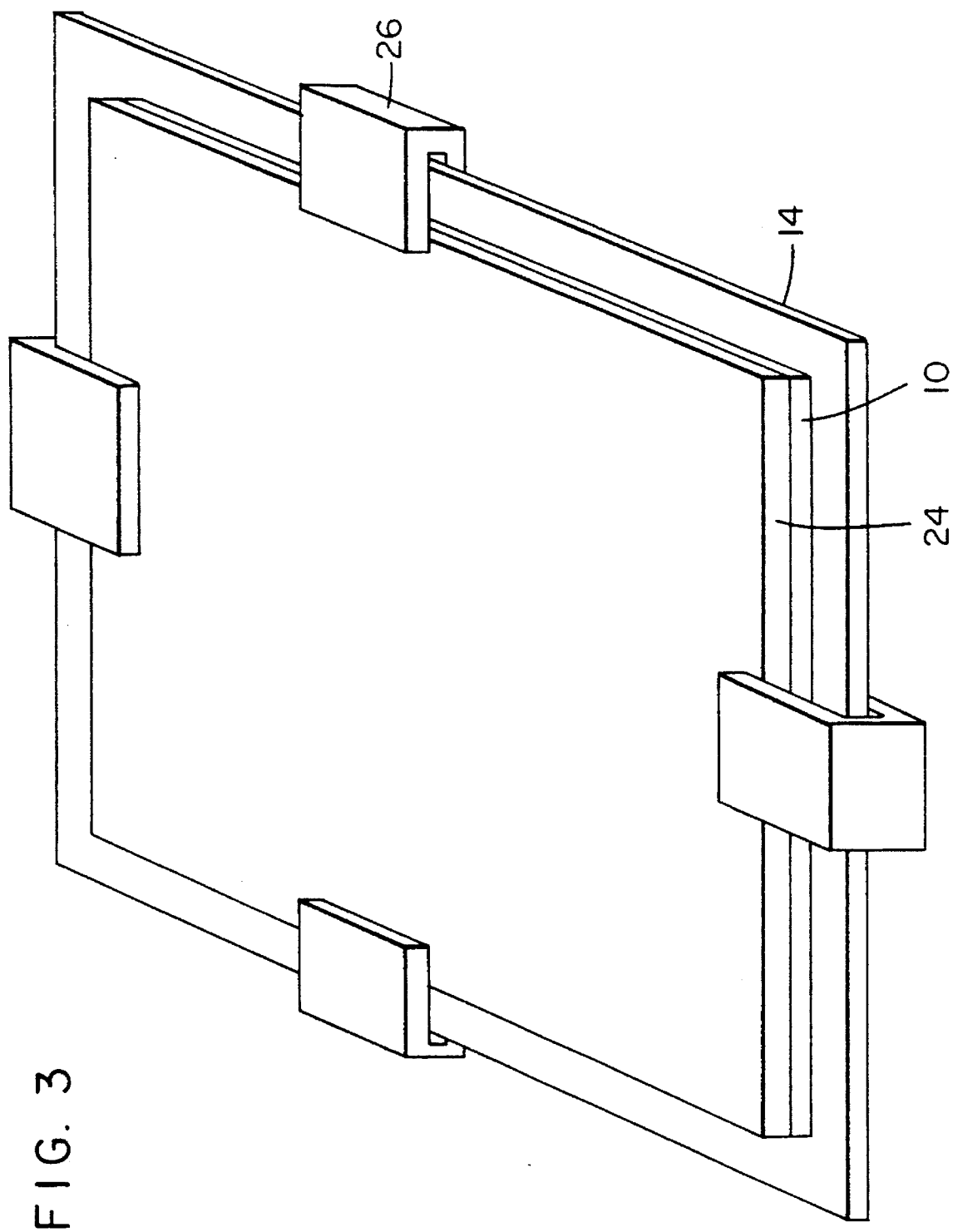
FIG. 3 is a perspective view of the template and substrate of FIG. 1 to which a cover sheet has been clamped.

To ensure that the metallic powder remains in opening 12 prior to curing, a solid sheet 24 of boron nitride or silicon nitride may be clamped to the top surface of template 10 using non-conducting clamps 26, as shown in FIG. 3. It should be understood, however, that this step is optional and may be eliminated if care is taken when transporting substrate 14 and template 10 to the curing chamber.

Figure 4:
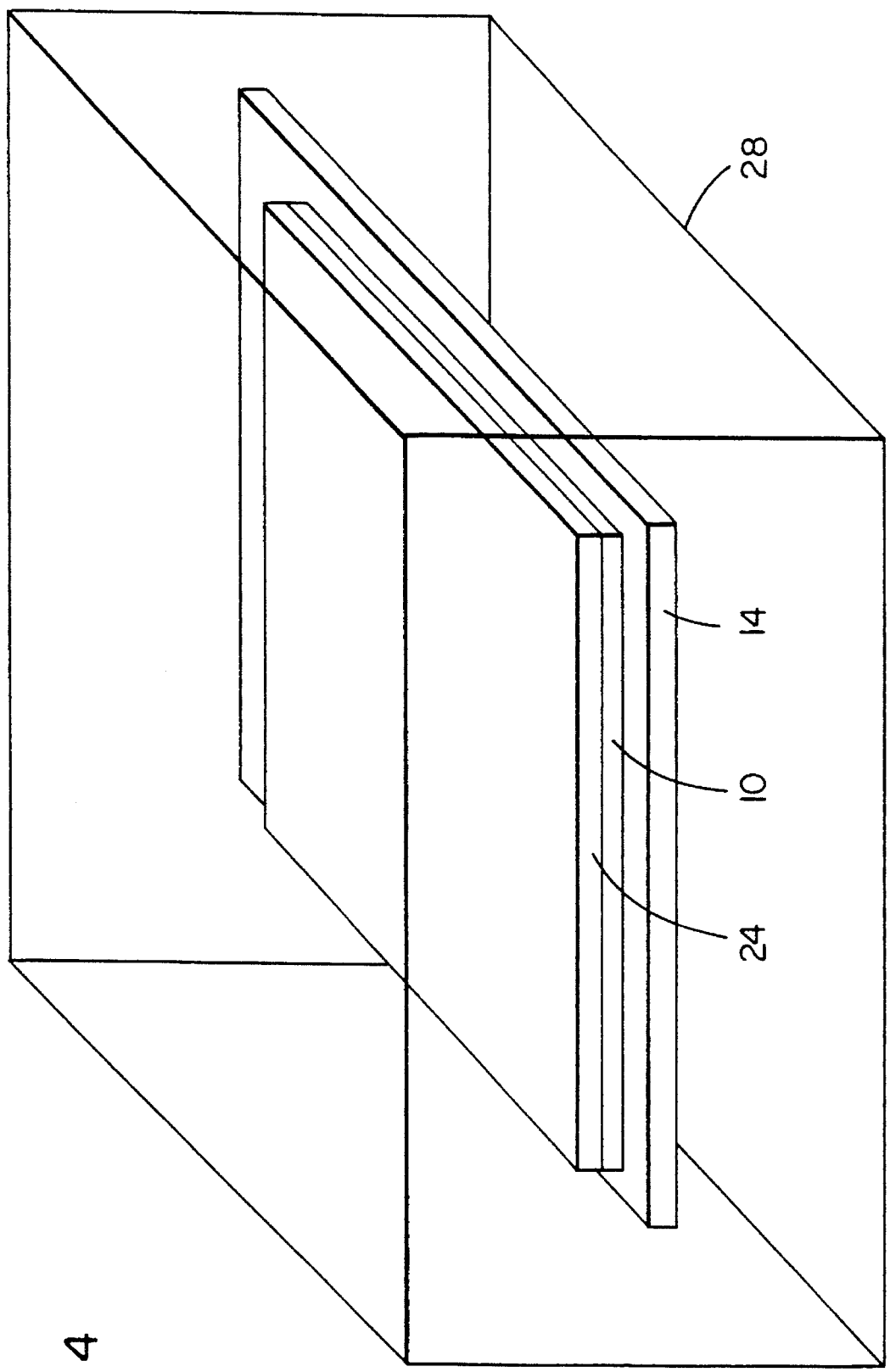
FIG. 4 is a perspective view of the assembly of FIG. 3 positioned in a curing unit.

Referring to FIG. 4, substrate 14, template 10 and sheet 24 (with clamps 26 not shown) are illustrated schematically inside curing chamber 28. A curing chamber suitable for use for the instant invention is disclosed in U.S. Pat. No. 5,239,408, entitled "Method for Curing Metal Particles into Continuous Conductors" and assigned to PrinTron, Inc., which application is incorporated by reference herein. As described therein, a high energy, high frequency electromagnetic field is applied which raises the temperature of the metallic particles to their melting point. When the particles melt they form continuous conductors whose physical boundaries are defined by openings 12. Since boron nitride has a higher melting temperature than the melted particles, the geometry of openings 12 are unaffected by the curing process. When curing is completed, substrate 14 is removed from the curing chamber. Sheet 24 and template 10 are then removed from substrate 14, leaving it with metallic conductors in the desired circuit pattern thereon.

Figure 5:
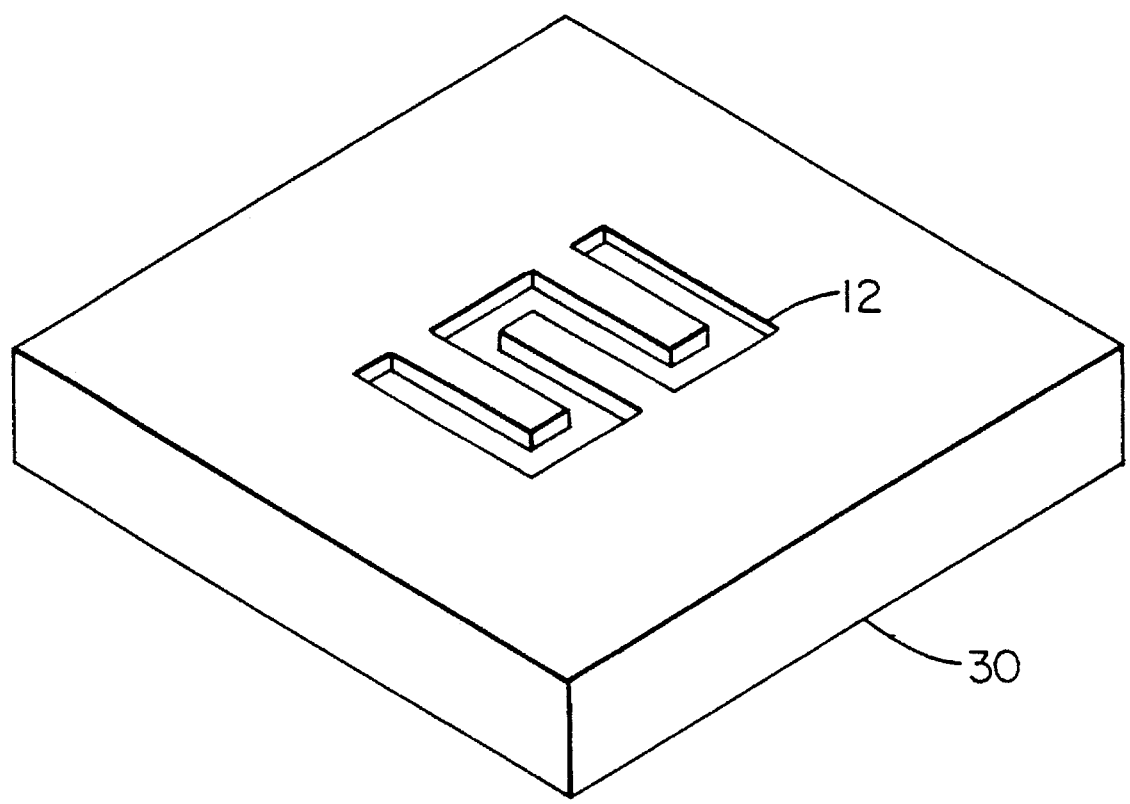
FIG. 5 is a perspective view of an alternative embodiment of the template of the present invention.

Another alternative embodiment of template 10 is shown in FIG. 5. In this embodiment the desired trace pattern 12 is milled at a depth corresponding to the desired trace thickness into a solid sheet 30 of boron nitride or silicon nitride which is thicker than this desired depth. For example, if the desired trace depth is 10 mils, the template could be ⅛ inch thick. After the trace pattern has been milled, metallic powder, not shown, is applied to the template, filling the voids corresponding to the trace pattern. Substrate 14 is then clamped to sheet 30 in the manner described above, sealing the metal particles in these voids. The assembly is then turned over so that the trapped metal particles now lie on the substrate in the desired pattern and inserted into curing unit 28, as described above. This embodiment has the advantage that thicker, and thus less fragile and more easily handled, templates may be used.

It will be readily seen by one of ordinary skill in the art that the present invention fulfills all of the objects set forth above. After reading the foregoing specification, one of ordinary skill will be able to effect various changes, substitutions of equivalents and various other aspects of the invention as broadly disclosed herein. It is therefore intended that the protection granted hereon be limited only by the definitions contained in the appended claims and equivalents thereof.

We claim:

1. A method of making a template for use in making printed circuit boards having openings therein in a predetermined pattern comprising the steps of:

(a) creating a trace on an upper surface of a solid sheet of boron nitride or silicon nitride;

(b) securing a substrate on a lower surface of the solid sheet;

(c) filling the trace on the upper surface with metallic particles in a sufficient amount to provide minimal shrinkage in the metallic particles after being melted; and (d) applying an electromagnetic field of sufficient energy to raise the temperature of the metallic particles to melting point and to adhere the metallic particles to the substrate.

2. A method according to claim 1, wherein each of the substrate and the solid sheet include locator holes for proper alignment.

3. A method according to claim 1, wherein the solid sheet and the substrate are secured to each other using clamping screws.

4. A method according to claim 1, wherein prior to the applying step (d), said method further comprises the step of securing another solid sheet of boron nitride to the upper surface of the solid sheet.

5. A method according to claim 1, wherein the boron nitride has a higher melting point than the melting point of the metallic particles.

6. A method according to claim 1, wherein said creating step (a) comprises the step of milling the trace on the upper surface of the solid sheet of boron nitride.

7. A method of making a template for use in making printed circuit boards having openings therein in a predetermined pattern comprising the steps of:

(a) creating a trace on an upper surface of a solid sheet of boron nitride or silicon nitride having a trace depth smaller than a depth of the solid sheet;

(b) filling the trace on the upper surface with metallic particles in a sufficient amount to provide minimal shrinkage in the metallic articles after being melted;

(c) securing another solid sheet of boron nitride to the upper surface of the solid sheet forming an assembly;

(d) turning the assembly over so that the metallic particles rest on the another solid sheet in a shape of the trace; and (e) applying an electromagnetic field of sufficient energy to raise the temperature of the metallic particles to melting point and to adhere the metallic particles to the substrate.

8. A method according to claim 7, wherein each of the solid sheets include locator holes for proper alignment.

9. A method according to claim 7, wherein the solid sheets are secured to each other using clamping screws.

10. A method according to claim 7, wherein the boron nitride or silicon nitride has a higher melting point than the melting point of the metallic particles.

11. A method according to claim 7, wherein said creating step (a) comprises the step of milling the trace on the upper surface of the solid sheet of boron nitride or silicon nitride.

12. A method of making a template for use in making printed circuit boards having openings therein in a predetermined pattern comprising the steps of:

(a) creating a trace on an upper surface of a solid sheet having boron nitride or silicon nitride, and having a trace depth smaller than a depth of the solid sheet;

(b) filling the trace on the upper surface with metallic particles in a sufficient amount to provide minimal shrinkage in the metallic articles after being melted;

(c) securing another solid sheet to the upper surface of the solid sheet forming an assembly;

(d) turning the assembly over so that the metallic particles rest on the another solid sheet in a shape of the trace; and (e) applying an electromagnetic field of sufficient energy to raise the temperature of the metallic particles to melting point and to adhere the metallic particles to the substrate.

13. A method according to claim 12, wherein each of the solid sheets include locator holes for proper alignment.

14. A method according to claim 12, wherein the solid sheets are secured to each other using clamping screws.

15. A method according to claim 12, wherein the solid sheets has a higher melting point than the melting point of the metallic particles.

16. A method according to claim 12, wherein said creating step (a) comprises the step of milling the trace on the upper surface of the solid sheet.

17. A method according to claim 12, wherein the metallic particles comprise one of copper, copper/silver alloy and tin/copper alloy.

18. An article capable of producing a circuit pattern comprising:

a removable boron nitride or silicon nitride substrate with a predetermined thickness, said substrate having a milled predetermined circuit pattern in said substrate, wherein the thickness of said milled predetermined circuit pattern is less than the thickness of the substrate; and said predetermined circuit pattern has metal particles therein.

* * * * *